(12) United States Patent
Liu et al.

(10) Patent No.: US 7,811,842 B2
(45) Date of Patent: Oct. 12, 2010

(54) LED ARRAY

(75) Inventors: Wen-Huang Liu, Guan-Xi Town (TW); Jui-Kang Yen, Taipei (TW)

(73) Assignee: SemiLEDs Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 11/622,150

(22) Filed: Jan. 11, 2007

(65) Prior Publication Data

US 2008/0171141 A1 Jul. 17, 2008

(51) Int. Cl.
*G01R 31/28* (2006.01)
(52) U.S. Cl. .............................. 438/26; 438/28; 438/33; 438/110; 438/128
(58) Field of Classification Search .................... 257/79, 257/690, 724, 88, 81, 82, 84, 89, 92, 100; 438/22, 106, 404, 460, 26, 28, 33, 110, 113, 438/128
See application file for complete search history.

(56) References Cited

U.S. PATENT DOCUMENTS

2003/0082890 A1* 5/2003 Eldridge et al. ............. 438/460
2005/0073846 A1* 4/2005 Takine ........................ 362/296
2005/0110036 A1* 5/2005 Park et al. ..................... 257/99
2006/0023451 A1* 2/2006 Han et al. .................... 362/249
2006/0044803 A1* 3/2006 Edwards ..................... 362/294
2006/0154390 A1* 7/2006 Tran et al. ..................... 438/22
2007/0228404 A1* 10/2007 Tran et al. ..................... 257/98

* cited by examiner

*Primary Examiner*—David Vu
*Assistant Examiner*—Suberr Chi
(74) *Attorney, Agent, or Firm*—Patterson & Sheridan, L.L.P.

(57) ABSTRACT

Methods for fabricating light-emitting diode (LED) array structures comprising multiple vertical LED stacks coupled to a single metal substrate is provided. The LED array structure may comprise two, three, four, or more LED stacks arranged in any configuration. Each of the LED stacks may have an individual external connection to make a common anode array since the p-doped regions of the LED stacks are all coupled to the metal substrate, or some to all of the n-doped regions of the LED stacks may be electrically connected to create a parallel LED array. Such LED arrays may offer better heat conduction and improved matching of LED characteristics (e.g., forward voltage and emission wavelength) between the individual LED stacks compared to conventional LED arrays.

22 Claims, 4 Drawing Sheets

LED ARRAY

BACKGROUND OF THE INVENTION

1. Field of the Invention

Embodiments of the present invention generally relate to light-emitting diode (LED) structures and, more particularly, to LED arrays.

2. Description of the Related Art

In applications where multiple instances of the same type of LED could be used, one or more LED arrays may replace at least some of the individual LEDs. An LED array may be defined as multiple LED dies packaged as a single unit, and several different configurations of LED arrays exist (e.g., isolated, common cathode, common anode, parallel, anti-parallel, and series-connected). By reducing the space required by individual LED packages and, in some cases, the number of pins required for external connection, LED arrays often utilize space more efficiently than individual LEDs, and this can lead to cost savings. Moreover, LED dies of an LED array may experience substantially the same temperatures and other ambient characteristics, thereby allowing for more closely matched behavior between the LED dies.

However, conventional LED arrays may be fabricated by dicing a wafer assembly into individual LED dies and subsequently packaging the dies together to create an LED array. LED dies formed in different areas of the wafer may have slightly different properties (e.g., layer thickness). In addition, LED dies to be packaged in an array may have been formed on different wafers. In such cases, the LED dies within an LED array may not have closely matched operating characteristics. For example, their forward voltages (VF) or emitted wavelengths may be slightly different Accordingly, what is needed is an improved LED array.

SUMMARY OF THE INVENTION

One embodiment of the present invention is a method for fabricating a light-emitting diode (LED) array. The method generally includes providing a wafer assembly (having a metal substrate, a plurality of LED stacks disposed above the metal substrate, and a conductive contact disposed above each of the LED stacks), testing the LED stacks to determine functional LED stacks, and dicing the wafer assembly to yield the LED array, such that the LED array comprises a group of two or more functional LED stacks disposed on a detached portion of the metal substrate.

Another embodiment of the present invention is a method for fabricating LED arrays. The method generally includes providing a wafer assembly (having a metal substrate, a plurality of functional LED stacks disposed above the metal substrate, and a conductive contact disposed above each of the LED stacks) and dicing the wafer assembly to yield the LED arrays, such that each of the LED arrays comprises a group of two or more functional LED stacks disposed on a detached portion of the metal substrate.

Yet another embodiment of the present invention provides a test system. The test system generally includes a wafer assembly (having a metal substrate, a plurality of LED stacks disposed above the metal substrate, and a conductive contact disposed above each of the LED stacks) and a tester configured to determine which of the LED stacks are functional and create a scheme for dicing the wafer assembly into a plurality of LED arrays based on locations of the functional LED stacks, wherein each of the LED arrays comprises a group of two or more functional LED stacks disposed on a detached portion of the metal substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a top view and a side view of a schematic representation of a light-emitting diode (LED) array composed of two LED stacks in accordance with an embodiment of the invention;

DETAILED DESCRIPTION

Figure 2A:
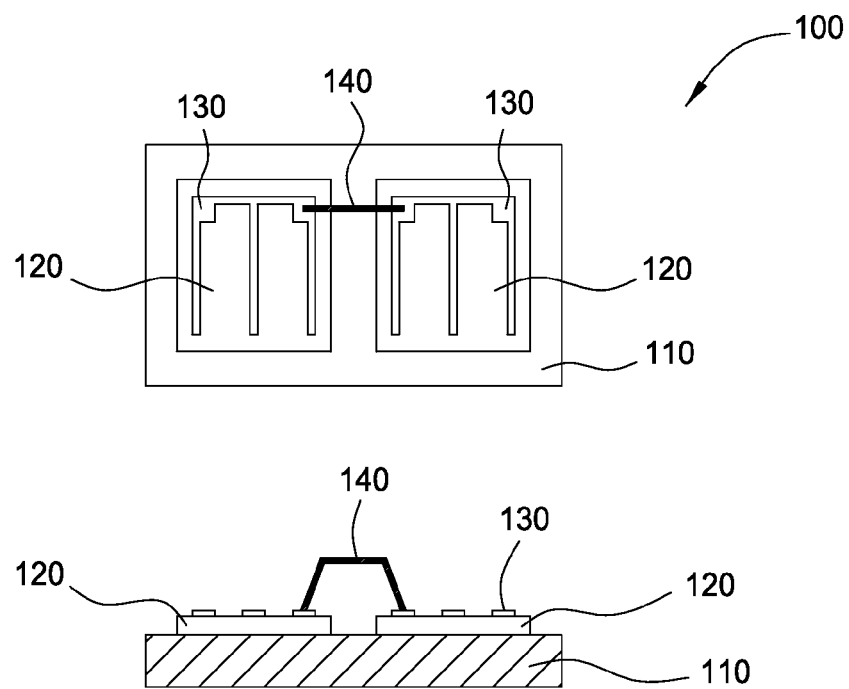
FIG. 2A is an electrical symbol representing the LED array of FIG. 1 composed of two parallel LED stacks.

Embodiments of the invention described herein provide techniques for fabricating light-emitting diode (LED) array structures comprising two or more LED stacks disposed on a metal substrate. Such LED arrays may have the advantages of more closely matched characteristics among the individual LEDs (e.g., same forward voltage and emitted wavelength), better heat conduction away from the junctions, easier handling and packaging during fabrication, and smaller size when compared to conventional LED arrays composed of separate dies.

An Exemplary LED Array Structure

FIG. 1 is a top view and a side view of a schematic representation of an LED array 100 composed of two LED stacks 120 disposed on a metal substrate 110. The LED stacks 120 may be from adjacent stacks when formed on the wafer assembly, for example, or there may be other structures (not shown), such as defective LED stacks or remnants of the fabrication process, disposed between the LED stacks of the functioning array structure. The LED stacks 120 themselves may be composed of a p-doped layer coupled to the metal substrate 110, an active layer for light emission disposed above the p-doped layer, and an n-doped layer disposed above the active layer. The p-doped, active, and n-doped layers may consist of compound semiconductor materials of $Al_xIn_yGa_{1-x-y}N$, $Al_xIn_yGa_{1-x-y}P$, or $Al_xGa_{1-x}As$, where $0 \leq x \leq 1$ and $0 \leq y \leq 1-x$. These different layers of the LED stacks 120 may comprise different materials As for the metal substrate 110, it may comprise a single layer or multiple layers of metal or metal alloys. For example, the metal substrate 110 may consist of copper, a copper alloy, or a composite metal alloy. The metal substrate 110 may be formed by any suitable method including, but not limited to, electrochemical deposition (ECD) and electroless chemical deposition (ElessCD). The metal substrate 100 may be bonded or coupled to the LED stacks 120 by any suitable means.

To pass electrical current through the LED stacks 120, an electrically conductive contact 130, such as a bonding pad, may be coupled to each of the LED stacks 120. More specifically, the contacts 130 may be coupled to the n-doped layer of the LED stacks 120. For some embodiments, a lead (not shown) for external connection may be coupled to each of the contacts 130. The shape of the contacts 130 may be designed to reduce the blockage of light emitted from the active layer.

Although not shown in FIG. 1, a reflective layer may be disposed between the metal substrate 110 and the LED stacks 120 in an effort to direct light emitted from the LED stacks 120 in a single direction (i.e., from the active layer to the n-doped layer and out of the LED). In other words, the reflective layer may reflect photons traveling from the active layer through the p-doped layer and redirect them so that these photons travel back towards the n-doped layer and out of the LED. Such a reflective layer may be composed of Ag, Al, Ni, Pd, Au, Pt, Ti, Cr, Vd, or combinations thereof. The reflective layer may also provide good heat conduction between the LED stacks 120 and the metal substrate 110.

Figure 2B:
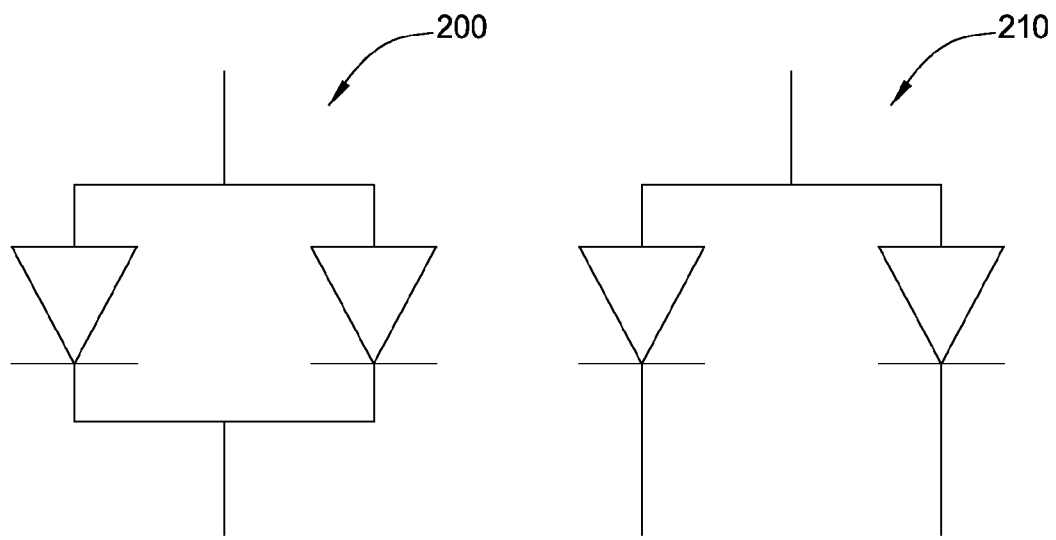
FIG. 2B is an electrical symbol representing an LED array composed of two common anode LED stacks in accordance with an embodiment of the invention.

For some embodiments, an interconnect 140 may electrically connect the contacts 130 of the two LED stacks 120 together. With the metal substrate 110 forming a common anode configuration 210 for the LED array 100 as shown in FIG. 2B, the addition of the interconnect 140 may allow for a parallel LED array configuration 200 as shown in FIG. 2A. The interconnect 140 may be a gold wire, for example, as shown in FIG. 1. For the parallel LED array configuration 200 with an interconnect 140 between the LED stacks 120, the contacts 130 may be coupled to only a single lead (not shown) for external connection. During fabrication of the LED array 100, the interconnect 140 may not be added until the LED stacks 120 have been tested to make sure the LED stacks 120 are both functional for some embodiments.

Figure 3:
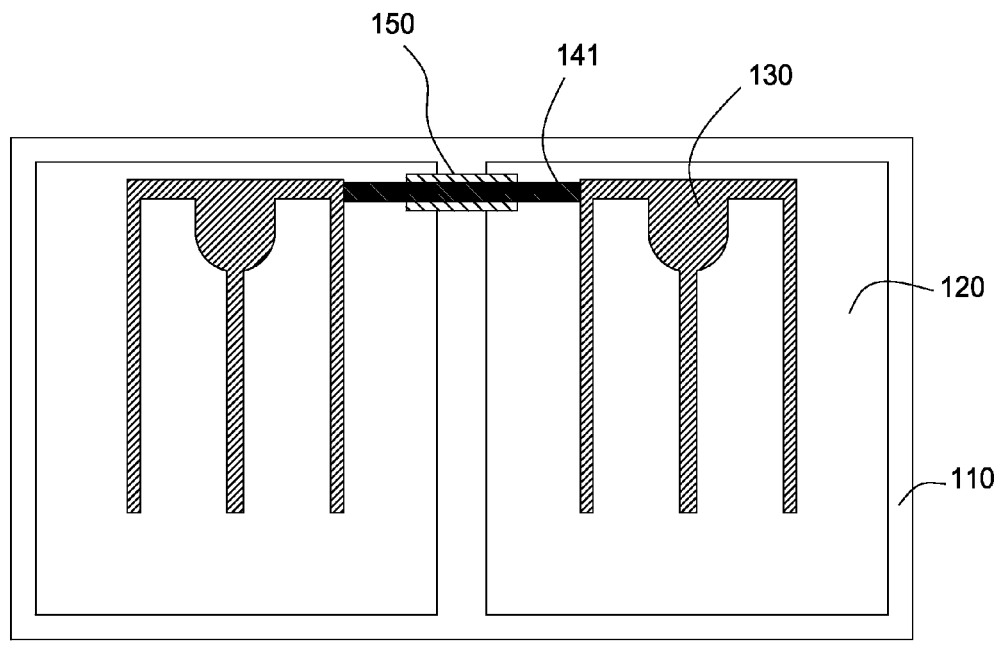
FIG. 3 is a top view of a schematic representation of a light-emitting diode (LED) array composed of two LED stacks illustrating the addition of an insulator in accordance with an embodiment of the invention.
Figure 4:
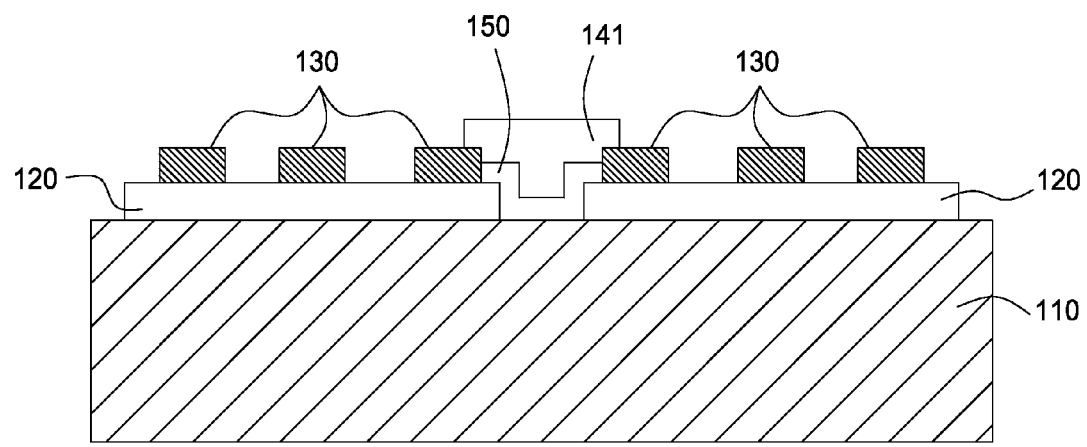
FIG. 4 is a cross-sectional schematic representation of a light-emitting diode (LED) array composed of two LED stacks illustrating the addition of an insulator in accordance with an embodiment of the invention.

To prevent shorting the interconnect 140 to the metal substrate 110 in a parallel LED array configuration 200, some embodiments may employ an insulator 150 disposed between the substrate 110 and the interconnect 140 as shown in the top view of FIG. 3 and the cross-section of FIG. 4. Other embodiments with a gold wire as the interconnect 140 may select the length or tension the wire such that it may not electrically short to the metal substrate 110. The insulator 150 may comprise an organic material, such as epoxy, a polymer, a parylene, a polyimide, a thermoplastic, and a sol-gel, or an inorganic material, such as $SiO2$, $Si3N4$, ZnO, $Ta2O5$, $TiO2$, HfO, and MgO.

The insulator 150 may be formed as an insulation layer before the contacts 130 are added to the LED stacks 120 and may cover more than just the area of the LED stacks 120 above which the interconnect 140 may later be placed. Undesired portions of the insulation layer may then be removed to form the insulator 150. For some embodiments, the insulator 150 may be formed after the contacts 130 are added to the LED stacks and only to selected areas of the LED array 100. As shown in FIG. 4, for some embodiments, the insulator 150 may fill in an area between the contacts 130 and between the LED stacks 120 above the metal substrate 110. For other embodiments, the insulator 150 may only fill in a portion of this area as shown in FIG. 3 where the insulator 150 does not adjoin the contacts 130. Formation of the insulator 150 may be accomplished by various suitable techniques, such as deposition, sputtering, evaporation, anode oxidation, coating, and printing.

For some embodiments as illustrated in FIGS. 3 and 4, a metal trace 141 may be formed above the insulator 150 and may compose the interconnect 140. The metal trace 141 may be formed by any of several suitable techniques, such as deposition, sputtering, evaporation, electroplating, electroless plating, coating, and printing.

LED arrays structured according to embodiments described herein may possess measurable advantages when compared to conventional LED arrays composed of separate dies. For example, constructing an LED array by utilizing LED stacks near or adjacent to one another on the same wafer assembly may produce more closely matched characteristics among the individual LEDs (e.g., same forward voltage and emitted wavelength) composing the LED array. Furthermore, the use of a single metal substrate shared by the individual LED stacks within an LED array may allow for better heat conduction away from the junctions, easier handling and packaging during fabrication, and smaller size when compared to conventional LED arrays.

Figure 5:
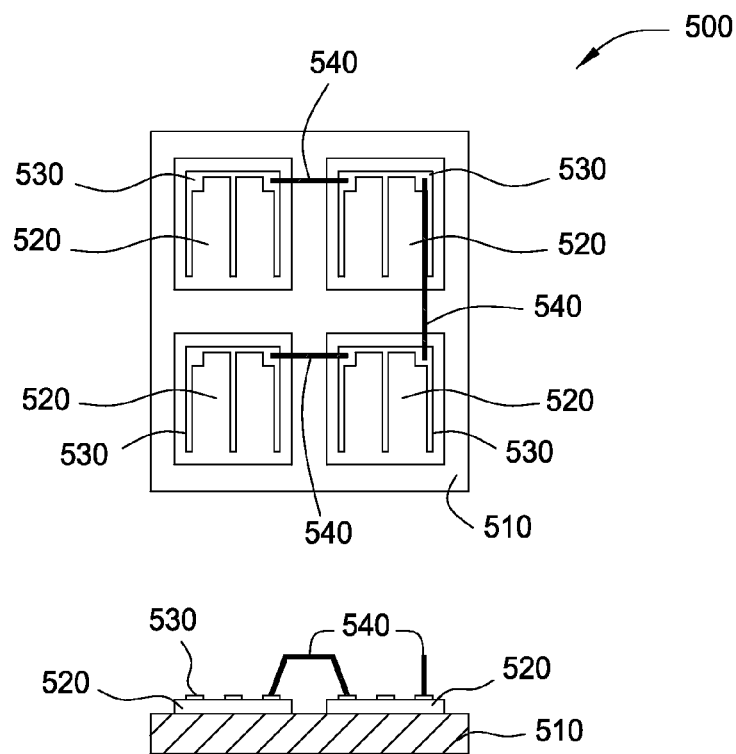
FIG. 5 is a top view and a side view of a schematic representation of an LED array composed of four LED stacks arranged in a square in accordance with an embodiment of the invention.

The LED array structure described herein is not limited to only two LED stacks. LED arrays of two or more LED stacks may be created, such as the LED arrays 500, 600 of FIGS. 5 and 6 comprising four LED stacks 520, 620. In FIG. 5, the LED stacks 520 are arranged in a square, and the contacts 530 are electrically connected by three interconnects 540, such as a gold wire or a metal trace, to create a parallel LED array configuration 700 as shown in FIG. 7A. As mentioned above, the LED stacks 520 may be from adjacent stacks when formed on the wafer assembly, for example, or there may be other structures (not shown), such as defective LED stacks or remnants from the fabrication process, disposed between the LED stacks 520 of the functioning array structure.

Figure 7A:
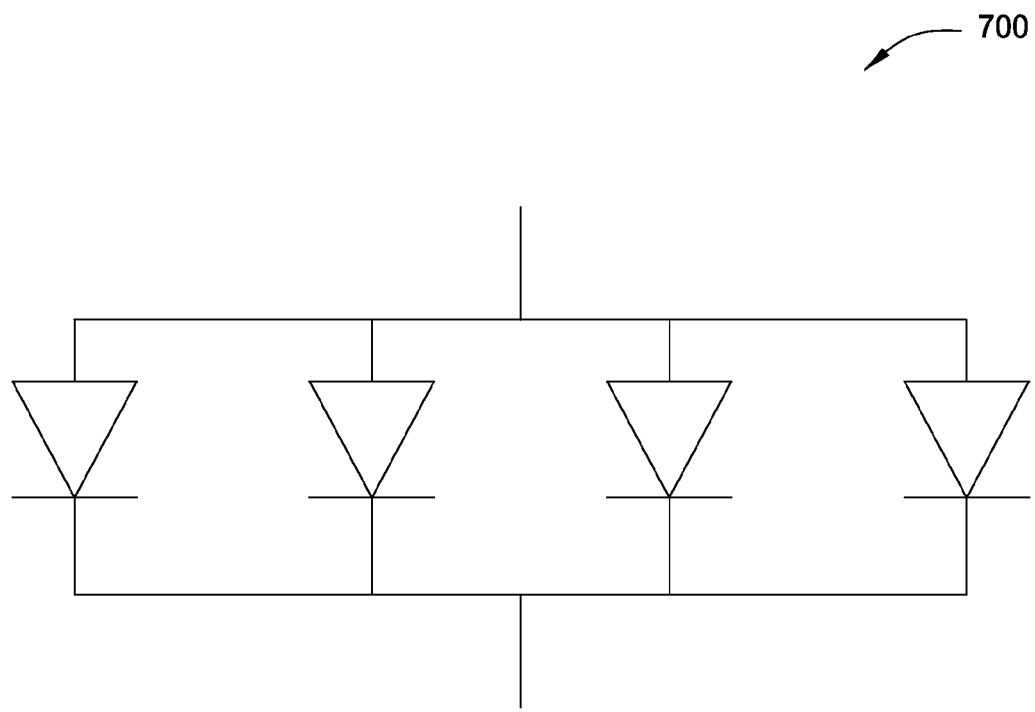
FIG. 7A is a circuit symbol representing the LED arrays of FIG. 5 and FIG. 6 composed of four parallel LED stacks.
Figure 7B:
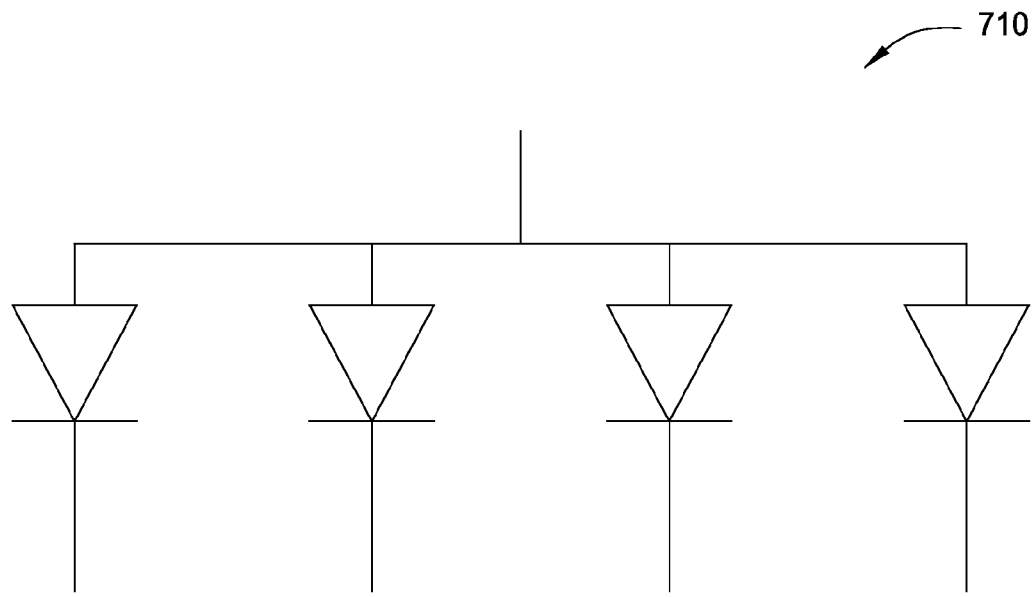
FIG. 7B is a circuit symbol representing an LED array composed of four common anode LED stacks in accordance with an embodiment of the invention.

For some embodiments, each of the contacts 530 may be coupled to a lead (not shown) for external connection. In such cases, there may not be interconnects electrically connecting the contacts 530 together, thereby forming a common anode configuration 710 as depicted in FIG. 7B.

In a parallel LED array configuration 700, the interconnects 540 may be arranged in any configuration to connect all four LED stacks 520 together. For example, a first interconnect 540 may connect the two upper LED stacks 520 together, a second interconnect 540 may connect the two lower LED stacks 520 together, and a third interconnect 540 may connect the two rightmost LED stacks 520 together as shown in FIG. 5. In some embodiments, a fourth interconnect 540 may connect the two leftmost LED stacks 520 together, and for some embodiments, the fourth interconnect 540 may replace any of the first, second, or third interconnects.

Figure 6:
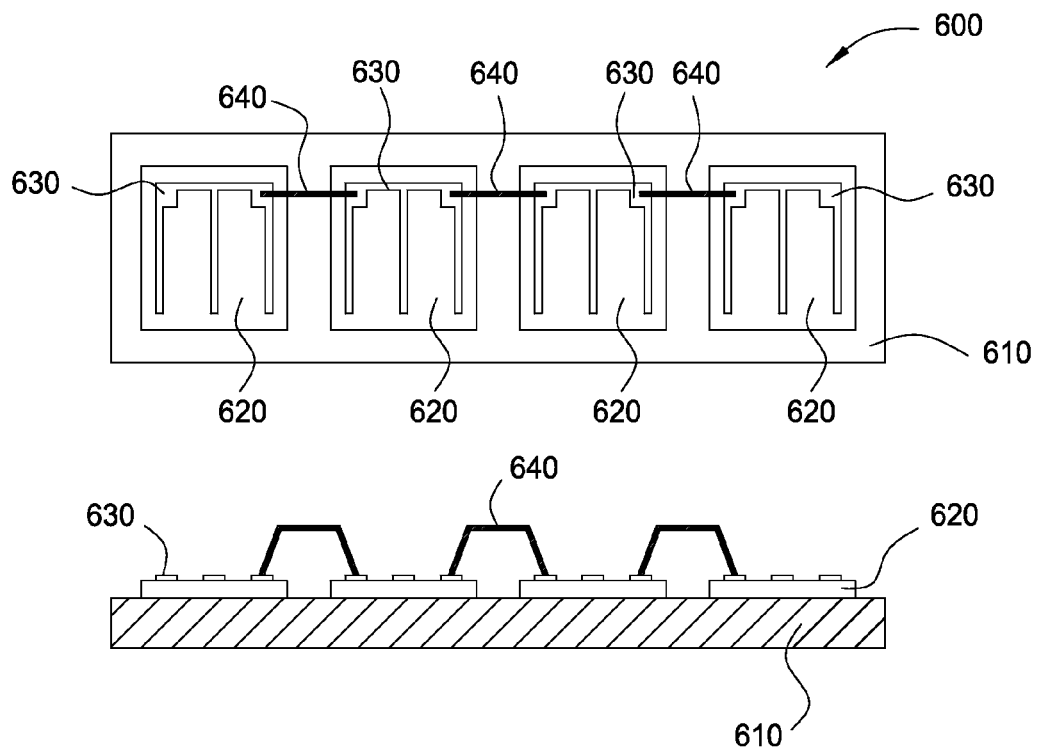
FIG. 6 is a top view and a side view of a schematic representation of an LED array composed of four LED stacks arranged in a row in accordance with an embodiment of the invention.

Referring now to FIG. 6, for some embodiments, the LED array 600 may comprise four LED stacks 620 arranged in a row and disposed on a metal substrate 610. A conductive contact 630 may be disposed on each of the four LED stacks 620. A lead (not shown) for external connection may be coupled to each of the contacts 630 to form the common anode configuration 710 of FIG. 7B, or at least three interconnects 640 may be connected to each adjacent pair of the LED stacks 620 as portrayed in FIG. 6 to function as the parallel LED array configuration 700 of FIG. 7A.

To fabricate the LED arrays from a wafer assembly comprising multiple LED stacks disposed on a metal substrate, wherein a conductive contact is disposed above each of the LED stacks, an instrument may be used to test the functionality of the LED dies. This instrument or another tool may also map the locations of the functional LED dies, and for some embodiments, an image of these locations may be displayed. Based on such a mapping, interconnects (and potentially insulators) may be added to the wafer assembly between pairs of functional LED dies, which may or may not be adjacent. The mapping may also be used to create a mask for etching the wafer assembly to remove nonfunctional LED dies and/or to dice the wafer assembly into individual LED arrays. The nonfunctional LED dies or portions thereof may be subsequently removed from the wafer assembly or may be left alone.

After mapping the functional LED dies, the wafer assembly may be diced accordingly. The mapping tool may create software instructions based on the locations of the functional LED dies and the desired production LED array configurations for a dicing tool to execute and dice the wafer accordingly. For some embodiments, the wafer may be diced into individual LED array structures strictly according to groups of two LED stacks. Other embodiments may dice solely according to groups of four LED stacks arranged in a row, in a square, or some other shape. For other embodiments, the wafer assembly may be diced into LED array structures with a combination of different numbers of LED stacks (e.g., LED arrays with two and four stacks produced from the same wafer assembly) based on, for example, production needs or favoring the highest number of LED stacks desired in an LED array (since a structure with more functional stacks is less likely to occur amongst adjacent LED stacks).

Although none of the LED arrays shown in the figures are packaged, those skilled in the art will recognize that the LED arrays may be at least partially encased in a housing comprising any suitable material, such as plastic or ceramic. Packaging may occur after the wafer assembly is diced into individual LED array structures comprising two, three, four, or more LED stacks. For some embodiments, the LED arrays may also be coupled to a lead frame, which provides leads for external connection.

While the foregoing is directed to embodiments of the present invention, other and further embodiments of the invention may be devised without departing from the basic scope thereof, and the scope thereof is determined by the claims that follow.

The invention claimed is:

1. A method for fabricating a light-emitting diode (LED) array, the method comprising:
   providing a wafer assembly comprising:
      a metal substrate;
      a plurality of LED stacks disposed above and electrically connected with the metal substrate to form a common anode configuration for the LED array; and
      a conductive contact disposed above each of the LED stacks;
   testing the LED stacks to determine functional LED stacks; and
   forming at least one interconnect directly coupling the conductive contact of a first functional LED stack to the conductive contact of a second functional LED stack in a parallel LED array configuration, such that a cathode of the first functional LED stack is connected to a cathode of the second functional LED stack through the at least one interconnect.

2. The method of claim 1, wherein the at least one interconnect comprises a gold wire or a metal trace.

3. The method of claim 1, wherein the metal substrate comprises a single layer or multiple layers.

4. The method of claim 1, wherein the metal substrate comprises a metal or a metal alloy selected from Cu, Cu alloy, and composite metal alloy.

5. The method of claim 1, wherein each of the plurality of LED stacks comprises:
   a p-doped layer disposed above the metal substrate;
   an active layer for emitting light disposed above the p-doped layer; and
   an n-doped layer disposed above the active layer.

6. The method of claim 5, wherein the p-doped layer, the n-doped layer, or the active layer comprises $Al_xIn_yGa_{1-x-y}N$, $Al_xIn_yGa_{1-x-y}P$, or $Al_xGa_{1-x}As$, where $0 \leq x \leq 1$ and $0 \leq y \leq 1-x$.

7. The method of claim 1, wherein the wafer assembly comprises a reflective layer disposed between the plurality of LED stacks and the metal substrate.

8. The method of claim 7, wherein the reflective layer comprises at least one of Ag, Al, Ni, Pd, Au, Pt, Ti, Cr, Vd, and combinations thereof.

9. The method of claim 1, further comprising coupling each conductive contact in the LED array to a lead for external connection.

10. The method of claim 1, further comprising at least partially encasing the LED array in a housing.

11. The method of claim 1, further comprising dicing the wafer assembly to yield the LED array, such that the LED array comprises a group of two or more functional LED stacks disposed on a detached portion of the metal substrate.

12. The method of claim 11, wherein at least two of the group of functional LED stacks were adjacent on the wafer assembly.

13. The method of claim 11, wherein the group includes the first and second functional LED stacks.

14. A method for fabricating a light-emitting diode (LED) array, comprising:
   providing a wafer assembly comprising:
      a metal substrate;
      a plurality of functional LED stacks disposed above and electrically connected with the metal substrate to form a common anode configuration for the LED array; and
      a conductive contact disposed above each of the LED stacks; and
   forming at least one interconnect directly coupling the conductive contact of a first functional LED stack in the plurality to the conductive contact of a second functional LED stack in the plurality in a parallel LED array configuration, such that a cathode of the first functional LED stack is connected to a cathode of the second functional LED stack through the at least one interconnect.

15. The method of claim 14, wherein the at least one interconnect comprises a gold wire or a metal trace.

16. The method of claim 14, wherein each of the plurality of functional LED stacks comprises:
   a p-doped layer disposed above the metal substrate;
   an active layer for emitting light disposed above the p-doped layer; and
   an n-doped layer disposed above the active layer.

17. The method of claim 16, wherein the p-doped layer, the n-doped layer, or the active layer comprises $Al_xIn_yGa_{1-x-y}N$, $Al_xIn_yGa_{1-x-y}P$, or $Al_xGa_{1-x}As$, where $0 \leq x \leq 1$ and $0 < y < 1-x$.

18. The method of claim 14, further comprising at least partially encasing the LED array in a housing.

19. The method of claim 14, further comprising dicing the wafer assembly to yield the LED array, such that the LED array comprises a group of two or more functional LED stacks disposed on a detached portion of the metal substrate, wherein the group includes the first and second functional LED stacks.

20. The method of claim 19, further comprising locating the functional LED stacks before dicing the wafer assembly.

21. The method of claim 19, wherein forming the at least one interconnect occurs before dicing the wafer assembly.

22. The method of claim 19, wherein the first and second functional LED stacks were adjacent on the wafer assembly.

* * * * *